United States Patent
Yamanashi (12)

(10) Patent No.: US 6,313,996 B1
(45) Date of Patent: Nov. 6, 2001

(54) HEAT RADIATION SYSTEM FOR ELECTRIC CIRCUITRY

(75) Inventor: Hidenori Yamanashi, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/219,486

(22) Filed: Dec. 23, 1998

(30) Foreign Application Priority Data

Dec. 25, 1997 (JP) .................................... 9-357648

(51) Int. Cl.[7] .................................................... H05K 7/20
(52) U.S. Cl. ........................ 361/706; 174/16.3; 338/22 R
(58) Field of Search ................... 428/34.9, 439; 174/16.3, 52.2, 52.3, 52.4; 361/704–706, 707–709, 713, 722, 58, 106, 111; 165/80.3, 185; 338/22, 249, 327, 328

(56) References Cited

U.S. PATENT DOCUMENTS

| | | | |
|---|---|---|---|
| 4,258,411 | * | 3/1981 | Sherman . |
| 4,327,282 | * | 4/1982 | Nauerth . |
| 4,689,878 | * | 9/1987 | Beauregard . |
| 4,703,339 | * | 10/1987 | Matsuo . |
| 5,006,696 | * | 4/1991 | Uchida . |
| 5,598,502 | | 1/1997 | Takahashi et al. . |
| 5,672,548 | | 9/1997 | Culnane et al. . |
| 5,781,412 | * | 7/1998 | de Sorgo . |
| 5,808,870 | * | 9/1998 | Chiu . |

FOREIGN PATENT DOCUMENTS

| | | | |
|---|---|---|---|
| 2000087 | * | 10/1988 | (CA) ..................................... 361/705 |
| 0 103 068 | | 3/1984 | (EP) . |
| 0 836 856 | | 4/1998 | (EP) . |
| 1 408 765 | | 10/1975 | (GB) . |
| 1 573 870 | | 8/1980 | (GB) . |
| 2 314 454 | | 12/1997 | (GB) . |
| 61-234502 | | 10/1986 | (JP) . |
| 62-163902 | | 10/1987 | (JP) . |
| 2-41161 | | 9/1990 | (JP) . |
| 4-78104 | | 3/1992 | (JP) . |
| 94/23450 | | 10/1994 | (WO) . |

OTHER PUBLICATIONS

IBM Tech Disol Bul vol. 19 No. 11 Apr. 1977 pp. 4279 "Conduction Path—Components" 361/705.*

* cited by examiner

*Primary Examiner*—Gerald Tolin
(74) *Attorney, Agent, or Firm*—Finnegan, Henderson, Farabow, Garrett & Dunner, L.L.P.

(57) ABSTRACT

A solid heat circuit comprises an adhesive elastic body (4) that has a stronger tendency to conduct heat than the air, contacts with both an electrically conductive solid heat source body (20, 21a, 22a) of a PTC device (2) and a metallic or ceramic heat sink body (5) for the PTC device, and supports the heat source body or the heat sink body.

19 Claims, 3 Drawing Sheets

HEAT RADIATION SYSTEM FOR ELECTRIC CIRCUITRY

BACKGROUND OF THE INVENTION

1. Field of the Invention

The present invention relates to a heat radiation system for electric circuitry.

More specifically, the invention relates to a heat radiation system for electric circuitry including a "solid body releasing heat in balance, as it has a higher temperature than a surrounding body" (hereafter called "solid heat source body" or simply "heat source"), a "solid body receiving heat in balance, as it has a lower temperature than the heat source" (hereafter called "solid heat sink body" or simply "heat sink"), and a "body of medium or media conducting heat in balance in between, as it has a gradient or gradients of temperature continuously descending from the heat source to the heat sink" (hereafter called "heat conducting circuit" or simply "heat circuit").

In particular, the invention is associated with electric circuitry having a "positive temperature coefficient thermistor" (hereafter called "PTC device"), and a heat radiation plate for the PTC device.

2. Description of Relevant Art

The PTC device is installed in an electric circuit connected to an electric load. The circuit conducts an electric current, which generates Joule's heat at "a positive temperature coefficient resistor element" (hereafter called "PTC element") of the PTC device, whereby the PTC element is heated and has a temperature in accordance with an occasional heat balance. If the temperature exceeds a specified level, the PTC element trips to have a suddenly increased resistance so that the current is interrupted.

To restore the PTC element, its temperature needs to be lowered by dissipating heat through a heat radiation mechanism, in which the PTC element and electrodes in contact therewith release heat and one or more forced or natural heat-radiation members and large heat-capacity structural members near the PTC element receives heat.

A known PTC element comprises a body of thermally sensitive polymer and a system of electrically conductive particles suspended therein, and the body of polymer is adapted for a significant thermal expansion to have a decreased density of conductive particles to provide an increased resistance. A PTC device with such a PTC element is sometimes employed for electric or electronic control in an automobile.

Conventional techniques for radiating heat from a PTC device have been the provision of a metallic enclosure or wall with or without fins, see Japanese Patent Application Laid-Open Publication No. 4-78104, published Mar. 12, 1992, Japanese Patent Application Laid-Open Publication No. 61-234502, published Oct. 18, 1986, Japanese Utility Model Application Laid-Open Publication No. 62-163902, published Oct. 17, 1987, and Japanese Patent Publication No. 2-41161, published Sep. 14, 1990.

SUMMARY OF THE INVENTION

In view of the inventor, there has been provided a conventional heat radiation system for electric circuitry, the system comprising a combination of an electric-current conducting body and one or more significantly heat-conductive members in contact therewith as a "solid heat source body", a surrounding structure or member in a vicinity of the solid heat source as a "solid heat sink body", and an intervening body of air between the solid heat source and the solid heat sink as a "gaseous heat circuit".

In the case of an electric circuit including a PTC device, the conventional heat radiation system comprises a combination of a PTC element and a pair of electrodes in contact therewith as a "solid heat source body with a tendency to thermally expand and contract", a heat radiation member in a vicinity thereof as a "solid heat sink body", and an intervening body of air therebetween as a "gaseous heat circuit".

If the surrounding structure or member in a vicinity is metallic, the system comprises a combination of an electric-current conducting body and one or more significantly heat-conductive members such as electrodes in contact therewith as an "electrically conductive solid heat source body", the surrounding structure or member in the vicinity as an "electrically conductive solid heat sink body", and an intervening body of air therebetween as an "electrically non-conductive or insulating (i.e. dielectric) gaseous heat circuit".

In any case, the gaseous heat circuit has a relatively small tendency to conduct heat, and is extremely susceptive to occasional factors so that it has an uncertain varying nature, unable to support a weight, and flees.

However, it has an extreme flexibility to occupy any form of space, accepts any intrusion or physical action, and never resists in a free space.

The present invention has been achieved with such points in view.

It therefore is an object of the present invention to provide a heat radiation system for electric circuitry including a heat circuit in which merits and demerits of a gaseous heat circuit are intentionally taken and improved, respectively.

To achieve the object, an aspect of the invention provides a heat radiation system for electric circuitry comprising a solid heat source body, a solid heat sink body, and a solid heat circuit interconnecting the solid heat source body and the solid heat sink body with each other, wherein the solid heat circuit comprises an elastic body having a larger tendency to conduct heat than the air.

In the heat radiation system for electric circuitry according to the aspect of the invention, the solid heat circuit can have an increased heat conductivity, hold the solid heat source body and the solid heat sink body within a desirable range of relative distance when either body is pushed toward the other, effectively eliminate influences of occasional factors, absorb displacements of and attenuate shocks to or vibrations of the solid heat source body and/or the solid heat sink body that may be a PTC element having a tendency to thermally expand and contract, provide a flexibility in design of outside dimensions and spacing, and have an improved handling nature.

The elastic body may preferably have a heat conductivity doner additionally suspended therein to have an increased heat conductivity, permitting a purpose-oriented control of heat conductivity.

The elastic body may preferably have an adhesive outer surface to permit an improved close contact with a sufficient retaining force.

The elastic body may preferably hold one of the solid heat source body and the solid heat sink body to eliminate a structural support therefor.

The elastic body may preferably have an adhesivity doner coated thereon and/or mixed therein so that the adhesive outer surface defines an application surface, permitting a decreased dust deposit.

The adhesive outer surface may preferably be coated with an exfoliative body to permit a post-application.

In the case of a metallic surrounding structure or member, the elastic body may preferably comprise a dielectric body and the solid heat source body and/or the solid heat sink body may preferably comprise a direct-current circuit such as a thermistor circuit, to avoid causing an undue induced current.

The solid heat source body may preferably comprise a PTC element.

The solid heat sink body may preferably comprise a metallic member.

The solid heat sink body may preferably comprise a ceramic member.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1A:
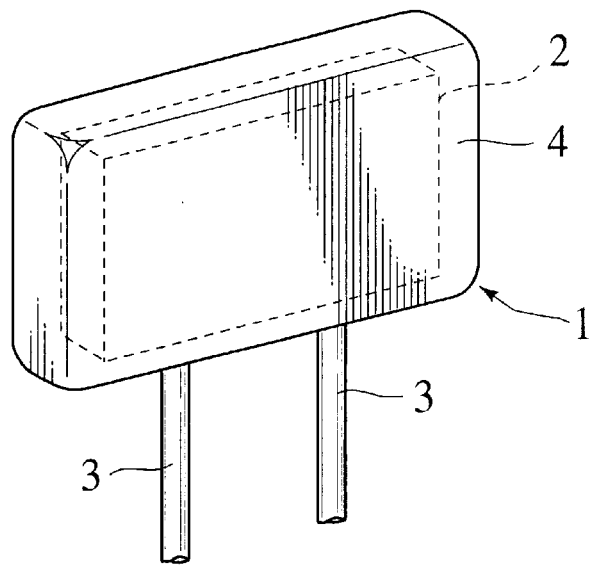
FIG. 1A is a schematic perspective view of a "combination of a PTC device and an elastic body coated thereon" (hereafter called "PTC article") as an essential portion of a heat radiation system according to an embodiment of the invention, which system is constituted as a "combination of the PTC article and a heat radiation piece attached thereto" (hereafter called "PTC radiation system")

There will be detailed below the preferred embodiments of the present invention with reference to the accompanying drawings. Like members are designated by like reference characters.

Figure 1B:
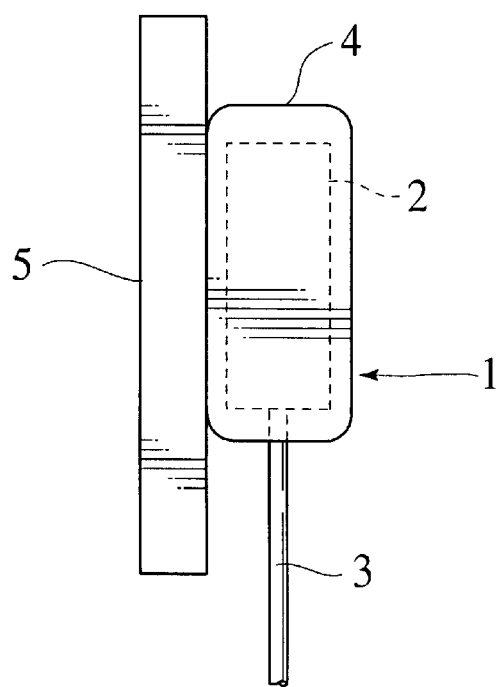
FIG. 1B is a schematic side view of the PTC radiation system.
Figure 2A:
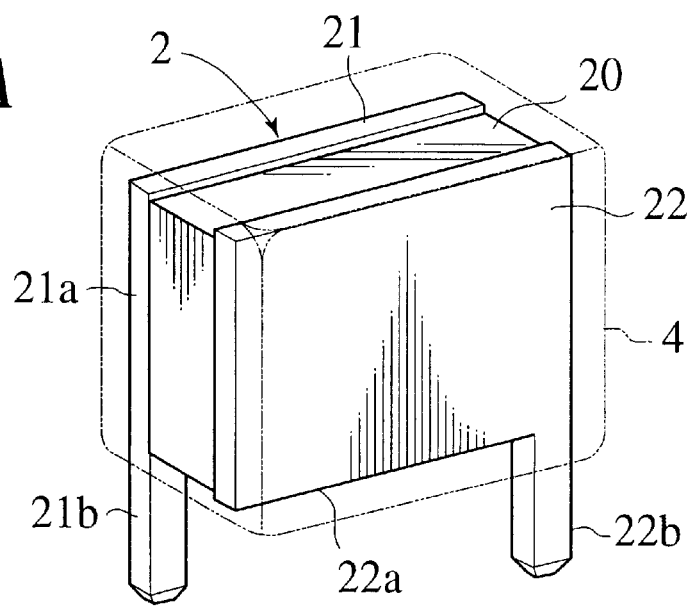
FIG. 2A is a perspective view of the PTC device in the PTC article of FIG. 1A, and FIG. 2B, a cross sectional view of the PTC article of FIG. 1A.
Figure 2B:
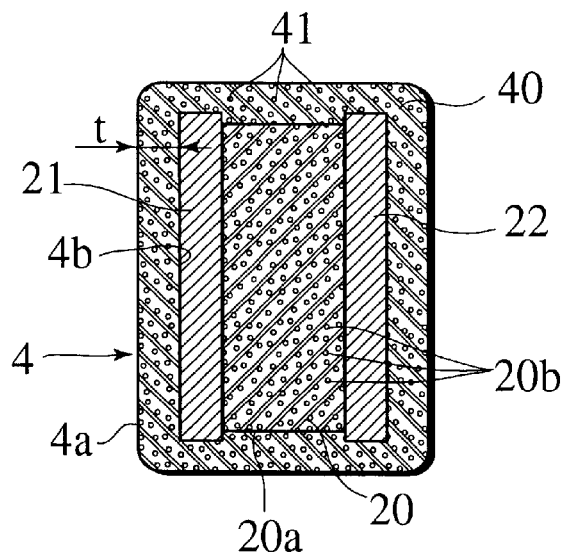

FIG. 1A shows a PTC article 1 of a PTC radiation system (1+5) according to a first embodiment of the invention, FIG. 1B, the PTC radiation system, FIG. 2A, a PTC device 2 in the PTC article 1, and FIG. 2B, a vertical cross section of the PTC article 1.

As shown in FIGS. 2A and 2B, the PTC device 2 comprises a PTC element 20, and a pair of left and right electrodes 21 and 22 attached to the PTC element 20.

The PTC element 20 comprises "a substantially rectangular parallelepiped body 20a of a thermally expansive and thermally compressive, heat-conductive and adhesive compound of one or more polymers and one or more additives such as for adhesion, and a system of electrically conductive resistor tissues or particles 20b suspended in the body 20a" (hereafter called "conductive polymer compound") that is adapted for a "positive temperature coefficient characteristic" (hereafter called "PTC characteristic") and generates heat upon conduction of direct current.

The left and right electrodes 21 and 22 comprise: left and right heat-conductive metallic electrode plates 21a and 22a bound by adhesive forces acting on whole areas of their inner surfaces to left and right sides of the PTC element 20 (more specifically, of the conductive polymer compound 20a), respectively; and conductors (in the form of straight terminals 21b and 22b in FIG. 2A or as wire leads 3 and 3 in FIG. 1A) joined, e.g. by integration or soldering, at upper ends thereof to staggered lower front and rear ends (FIG. 2A) or arbitrary locations on outer surfaces (FIG. 1A) of the left and right electrode plates 21a and 22a, respectively.

The PTC element 20 and the electrode plates 21a and 22a constitute an electrically conductive, thermally expansive and contractive solid heat source body in the PTC radiation system of FIG. 1B.

As shown in FIG. 1A, the PTC article 1 comprises the PTC device 2 and an adhesive elastic body 4 (or layer or film) put or coated over an entire outer surface of the heat source body (20+21a+22a).

As shown in FIG. 2B, the elastic body 4 comprises: an object-conforming body 40 of an elastic, wholly or at least partially electrically non-conductive (i.e. dielectric), physically adhesive, heat-conductive and wholly or layer-wise homogeneous compound of a silicon gel and a basic quantity or basic quantities of one or more additives (e.g. silica or alumina) such as for heat conduction and adhesion; and a wholly or layer-wise homogeneous system of a controlled additional quantity of well heat-conductive minute synthetic or crystalline, dielectric particles 41 (or pieces or tissues) suspended in the compound body 40. The suspended particles 41 (or pieces or tissues) are identical to the additive(s), but may be different. The compound body 40 has a higher heat conductivity than the air, as a whole or layer-wise, as necessary. The suspended system 41 is higher in heat conductivity than the compound body 40, as a whole or component-wise, as necessary. Therefore, the elastic body 4 has a by far stronger tendency to conduct heat than the air. The additives in the silicon gel compound of the elastic body 4, such as for adhesion and heat conduction, may be controlled in quantity, area and/or layer-wise to provide a flexibility in design. The suspended system 41 may be omitted for general applications where the elastic body 4 is expected to have a significantly stronger tendency to conduct heat than the air. The elastic body 4 may be applied on the heat source body (20+21a+22a) by a dipping, molding, spraying or other applicable techniques for the coating, e.g. by simply putting.

An outside 4a of an entirety of the elastic body 4 has a substantially rectangular parallelepiped form. An inside 4b of the entirety of the elastic body 4 envelopes over and adheres to an entire outer surface of the heat source body. In a respective direction (e.g. X, Y or Z orthogonal direction in an associated coordinate system), the elastic body 4 has greater thicknesses than a specified thickness t (preferably $\geq 0.5$ mm) between inside 4b and outside 4a, as the thickness t is determined for a required conforming elastic deformation at each application side of the body 4 to allow a maximal linear expansion and contraction through a trip of the heat source body (more specifically, of the PTC element 20) without undue counter force in the respective direction, in consideration of a configuration and dimensions of the electrodes 21 and 22 that may have an over-span or underspan relative to the PTC element 20. Such a thickness (t) is to enable applications to a limited spacing (e.g. FIG. 3 or 4), and may be voluntarily determined for general use.

The elastic body 4 may have an envelope form opening at one end or both ends for insertion of the heat source body and at some locations for joining the conductors, and may additionally have (a) cover(s) to close the opening.

The elastic body 4 may comprise a plurality of divided or separable parts of a ring or sheet form. One or more sheets of elastic body (4) may be patched simply on an application side of the heat source body. Any such elastic body, as already attached or provided alone or as a formatted patch sheet to be scissored, may be sold in the form of an elastic body article (4 with or without 60 [FIG. 5]) that may be protected at the remaining side or both sides with a conforming exfoliable sheet (60 [FIG. 5]) of processed paper and/or resin or metal enclosure put thereon and easy to peel or remove.

The elastic body 4 may comprise a less adhesive or simply frictional inner surface layer for holding or accommodating the heat sink body, an elastic inter-surface layer with a nominal thickness (t), and a significantly adhesive outer surface layer or film for a void-free adherence to the heat sink body.

In a prefabricated form of the PTC article 1 or in a processed form, the elastic body 4 may be adhesive or may have an adhesive layer or film simply at or over a specified or probable application side to the heat sink body, or may have a non-adhesive edge or surface region, each for an exposed application to an atmosphere needing a cleaner.

The elastic body 4 may comprise an adhesive elastomer such as an adhesive rubber or polymer. Note the body 40 is not an adhesive tape.

As shown in FIG. 1B, a substantially rectangular heat-conductive metallic and/or ceramic, crystalline or synthetic heat radiation plate 5 is attached to an outside (4a in FIG. 2B) of the PTC device 1, to be carried by adhesive forces of the elastic body 4. The conductor 3 (or 21b and 22b in FIG. 2A) is soldered to a printed circuit on a substrate or fitted in a connector, or may be a free-standing lead to support an entire system. The radiation plate 5 may be part of a structure or substrate and may carry the PTC device 1 attached thereto.

The radiation plate 5 constitute a solid heat sink body in the PTC radiation system (1+5). Heat is effectively conducted from the heat source body (20+21a+22a) via the elastic body 4 to the heat sink body (5) and to outside thereof, so that the PTC element 20 has a controlled temperature rise.

According to the first embodiment, as a heat source body of a PTC device 2 has an adhesive elastic body 4 coated thereon, a radiation plate 5 can be attached thereto with ease by use of the adhesivity of elastic body 4. A resultant provision of the elastic body 4 in between and in void-free contact with both the heat source body and the radiation plate 5 as a heat sink body permits an enhanced heat conduction from the heat source body to the heat sink body, giving rise to an increased radiation efficiency, allowing for the PTC device 2 to be designed with an increased capacity for current conduction. Further, in application to an automobile or the like, the elastic body 4 effectively absorbs or attenuates occasional shocks or vibrations to the PTC device 2, as the radiation plate 5 is cooperative therefor.

Figure 3:
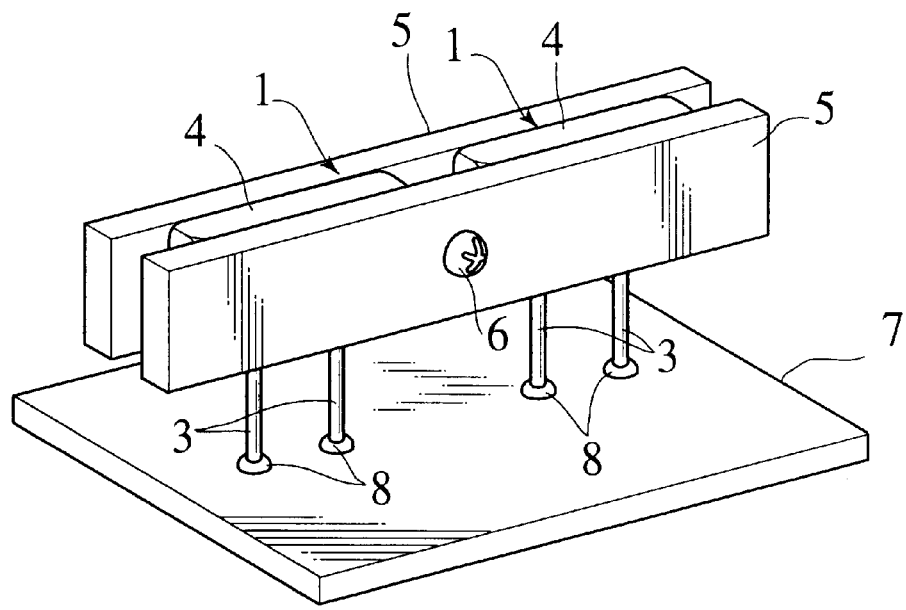
FIG. 3 is a perspective view of a PTC radiation system according to another embodiment of the invention.

FIG. 3 shows a PTC radiation system (1+5) according to a second embodiment of the invention.

In this radiation system, a pair of left and right spaced and aligned PTC articles 1 are supported by lead terminals 3 thereof, which (3) are joined at their lower ends by solder 8 to a printed circuit board 7. The left and right PTC articles 1 have elastic bodies 4 thereof supporting a pair of front and rear horizontal heat radiation plates 5. These radiation plates 5 are attached by adhesion to front and rear application surfaces of the elastic bodies 4, and are fastened to each other by a machine screw 6 provided through the plates 5 and between the PTC articles 1 so that the plates 5 are spaced from each other at a distance a little smaller than a normal thickness of each article 1 at a room temperature. The left and right PCT articles 1 may be attached to each other at their side faces, and the plates 5 may be fastened by a pair of left and right screws spaced from each other at a larger distance than a doubled width dimension of each article 1.

According to the second embodiment, a tripping thermal expansion in a thickness direction of a heat source body of either PTC article 1 can be absorbed as front and rear portions of an elastic body 4 between the heat source body and radiation plates 5 elastically conformingly deform in a laterally escaping manner, and the plates 5 can be brought into void-free full contact with each PTC article 1, permitting the more enhanced heat conduction, achieving an enhanced radiation efficiency.

Figure 4:
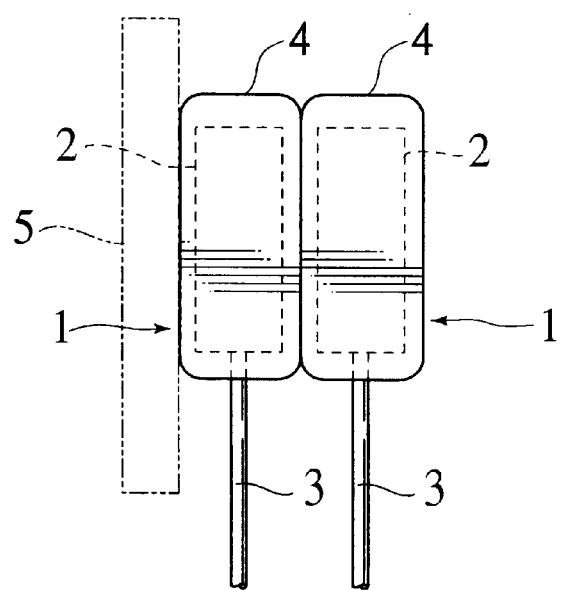
FIG. 4 is a schematic side view of an essential portion of a PTC radiation system according to another embodiment of the invention.

FIG. 4 shows a PTC radiation system (1+5) according to a third embodiment of the invention.

In this radiation system, a pair of front and rear PTC articles 1 adhere to each other at mutually facing sides of their elastic bodies 4 without voids, and an opposite side of either or each article 1 is to likewise stick to a single or corresponding heat radiation plate 5.

According to the third embodiment, a pair of joined heat circuits permit an enhanced interfacial heat dissipation capacity and an increased device density. A pair of mutually adhering elastic bodies 4 work as an efficient thermal coupler with an increased heat dissipation capacity.

Figure 5:
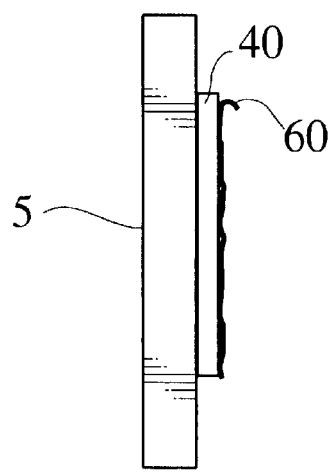
FIG. 5 is a schematic side view of a "combination of a heat radiation piece and an elastic body attached thereto" (hereafter called "radiation article") as an essential portion of a PTC radiation system according to another embodiment of the invention.

FIG. 5 shows a heat radiation article (5+40+60) for a PTC radiation system according to a fourth embodiment of the invention.

The radiation article comprises a metallic or ceramic heat radiation plate 5, an elastic sheet of adhesive compound 40 adhering to the radiation plate 5, and an exfoliable sheet 60 of paper or resin covering an outer surface of the compound 40 and adapted to be peeled off with ease by fingers.

For application, the sheet 60 of paper is removed, and the outer surface of the compound 40 is brought into void-free contact with a heat sink body of the radiation system.

The adhesive compound 40 may have a system of particles (41 in FIG. 2B) suspended therein.

It will be seen that the foregoing embodiments can be combined in a voluntary manner.

The embodiments described have such an aspect that, in a heat radiation system for a PTC device provided with a heat radiation plate as a heat sink body to be attached thereto, a surface of a heat source body of the PCT device is coated with a heat-conductive adhesive elastic agent, and the heat radiation plate is attached by an adhesive force of the coated agent.

As the coated elastic agent is adhesive, the radiation plate can be attached to the heat source side with ease. As the heat-conductive agent is in void-free contact with both the heat source body and the heat sink body, heat is efficiently conducted between from heat source to heat sink, permitting an enhanced radiation.

Moreover, a pair of heat radiation plates are attached to both sides, each to one side, of a heat source body of a PTC device coated with a heat-conductive adhesive elastic agent, and are fastened to be fixed relative to each other by a screw.

As the elastic agent absorbs an occasional tripping thermal expansion of the heat source body of the PTC device, the heat source body coated with the agent can be fitted in a void-free manner between the radiation plates.

Further, a pair of PTC devices having their heat sink bodies coated with adhesive elastic layers are fixedly attached to each other by the adhesive layers, permitting a void-free contact in between, achieving an enhanced heat coupling characteristic.

While preferred embodiments of the present invention have been described using specific terms, such description is for illustrative purposes, and it is to be understood that changes and variations may be made without departing from the spirit or scope of the following claims.

What is claimed is:

1. A heat radiation system for electric circuitry comprising:
   a solid heat source body variable in volume in dependence on temperature thereof;
   a solid heat sink body; and
   a solid heat circuit interconnecting the solid heat source body and the solid heat sink body with each other,
   wherein the solid heat circuit comprises an elastic body having a larger tendency to conduct heat than air, the elastic body substantially surrounding and directly contacting the solid heat source body,
   wherein the solid heat source body comprises a plurality of PTC elements, each interposed between at least two electrodes, and
   wherein the adhesive elastic body comprises a plurality of adhesive elastic enclosures, each respectively enclosing a corresponding electric PTC element, and adhesively joined to each other.

2. The system as claimed in claim 1, wherein the elastic body has a heat conductivity doner additionally suspended therein to have an increased heat conductivity.

3. The system as claimed in claim 1, wherein the elastic body has an adhesive outer surface.

4. The system as claimed in claim 1, wherein the elastic body has an adhesivity doner coated thereon.

5. The system as claimed in claim 1, wherein the elastic body has an adhesivity doner mixed therein.

6. The system as claimed in claim 1, wherein the elastic body has an adhesive surface coated with an exfoliative body.

7. The system as claimed in claim 1, wherein the elastic body comprises a dielectric body, and the solid heat source body comprises a direct-current conductive element including the plurality of PTC elements.

8. The system as claimed in claim 1, wherein the solid heat sink body comprises a metallic member.

9. The system as claimed in claim 1, wherein the solid heat sink body comprises a ceramic member.

10. A heat radiation system for electric circuitry comprising:
    a support;
    a solid heat source body mounted on the support, the solid heat source body being variable in volume in dependence on temperature thereof;
    a heat sink body free of the support; and
    a solid heat circuit interconnecting the solid heat source body and the solid heat sink body;
    wherein the solid heat circuit comprises an adhesive elastic body having a larger tendency than air to conduct heat, and
    wherein the solid heat source body comprises a plurality of electric circuit elements, and the adhesive elastic body comprises a plurality of adhesive elastic enclosures, each respectively enclosing a corresponding electric circuit element, and adhesively joined to each other.

11. A heat radiation system for electric circuitry comprising:
    a support;
    a solid heat source body mounted on the support, the solid heat source body being variable in volume in dependence on temperature thereof;
    a heat sink body free of the support; and
    a solid heat circuit interconnecting the solid heat source body and the solid heat sink body;
    wherein the solid heat circuit comprises an adhesive elastic body having a larger tendency than air to conduct heat, a side of the adhesive elastic body contacting the solid heat source body, and another side of the adhesive elastic body contacting the solid heat sink body to support the solid heat sink body.

12. The system as claimed in claim 11, wherein the solid beat sink body comprises a heat dissipation member for dissipating heat into ambient air.

13. The system as claimed in claim 11, wherein the solid heat sink body comprises a pair of heat radiation plates disposed on opposite sides of the solid heat source body and fastened to each other.

14. The system as claimed in claim 11, wherein the adhesive elastic body comprises a silicon gel.

15. The system as claimed in claim 10, wherein each of the electric circuit elements comprises a PTC element composed of a PTC resistor of a parallelepiped configuration, and a pair of electrodes contacting on opposite sides of the PTC resistor.

16. The system as claimed in claim 11, wherein the solid heat source body comprises a plurality of electric circuit elements, and the adhesive elastic body comprises a plurality of adhesive elastic enclosures, each respectively enclosing a corresponding electric circuit element, and adhesively joined to each other.

17. The heat radiation system according to claim 10, wherein the solid heat circuit comprises an adhesive elastic body having an exfoliative body attached to a side thereof.

18. The heat radiation system according to claim 10, wherein the at least two electrodes are of flat plate-like configuration to provide enhanced heat transfer from the heat source body.

19. The heat radiation system according to claim 10, wherein the at least two electrodes are of flat plate-like configuration to provide enhanced heat transfer from the heat source body.

* * * * *